Feb. 16, 1960 A. N. DE SAUTELS 2,925,559

TEMPERATURE COMPENSATED FEEDBACK TRANSISTOR CIRCUITS

Filed Oct. 28, 1955

INVENTOR.
ALBERT N. DESAUTELS
BY
ATTORNEY 2,925,559

TEMPERATURE COMPENSATED FEEDBACK TRANSISTOR CIRCUITS

Albert N. De Sautels, Minneapolis, Minn., assignor to Minneapolis-Honeywell Regulator Company, Minneapolis, Minn., a corporation of Delaware Application October 28, 1955, Serial No. 543,462

5 Claims. (Cl. 330—23)

This invention relates to a gain compensated transistor amplifier circuit which has an improved and novel arrangement for minimizing the variations in amplifier power gain due to ambient temperature changes.

In recent years there has been an increasing demand, especially in the aircraft and missile fields, for electronic equipment capable of operating over extended ranges of ambient temperature, with little, if any, changes in operating characteristics resulting therefrom. In the field of transistor amplifiers, for example, one of the vexing problems encountered has been a variation in amplifier power gain at both high and low ambient temperature extremes when compared with the gain available at normal room temperature. This is due in part to the fact that the characteristics of many of the components used in electronic equipment are affected by temperature variations.

It is an object of this invention therefore to provide means for equalizing the power gain of a transistor amplifier over extended temperature ranges.

It is another object of this invention to provide a feedback path around the amplifier, which feedback path includes impedances variable with temperature to compensate for changes in power gain due to variations of the characteristics in other components of the circuit.

Figure 1:
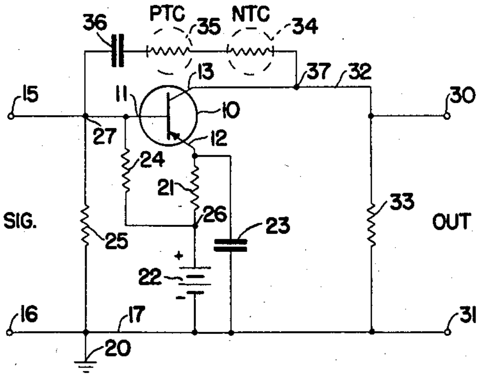
Figure 2:
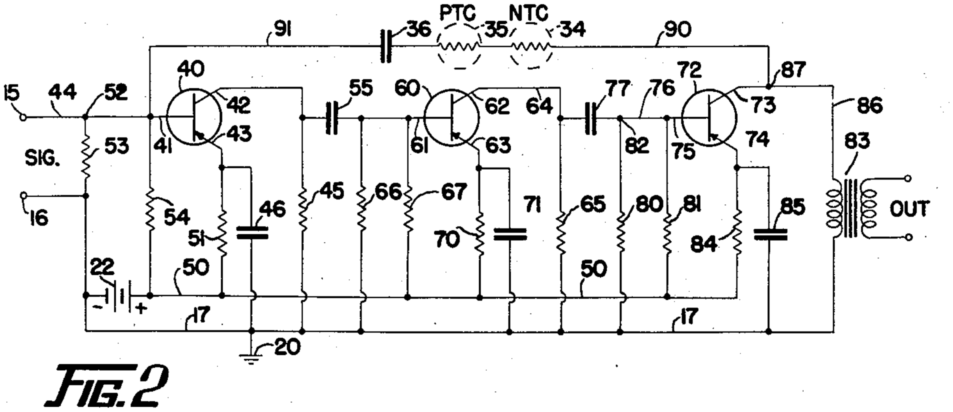
Figure 3:
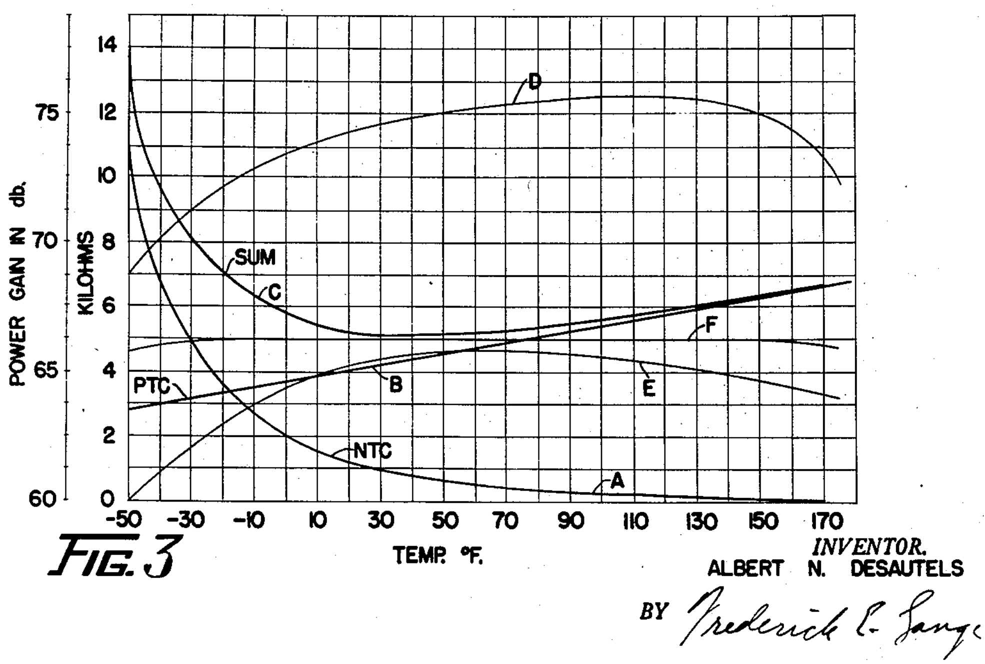

These and other objects of the present invention will be understood upon consideration of the accompanying specification, claims and drawings of which:

Figures 1 and 2 are diagrammatic representations of an embodiment of the invention, and Figure 3 is a graphical representation explaining the operation of the invention.

Referring now to Figure 1, there is shown a schematic representation of a single stage transistor amplifier embodying the invention. A transistor 10 is shown having a base 11, an emitter 12, and a collector 13. The transistor 10 as shown is a junction PNP type, however, any suitable type transistor may be used. The base 11 of the transistor is connected by a conductor 14 to an input terminal 15 of a pair of input terminals 15 and 16. Input terminal 16 is connected to a conductor 17 which is grounded at 20. The emitter 12 is connected to the ground conductor 17 through a resistor 21 and a source of potential 22, shown as a battery. A bypass capacitor 23, is connected in parallel with the resistor 21 and the battery 22. A pair of resistors 24 and 25 provide the bias to the base 11 of the transistor. The resistor 25 is connected from conductor 17 to the base 11 of the transistor, and the resistor 24 is connected from the base 11 to a junction 26 between the positive terminal of battery 22 and resistor 21. The amplifier has a pair of output terminals 30 and 31, terminal 31 being connected directly to the ground conductor 17, and terminal 30 being directly connected to the collector 13 by a conductor 32. The collector 13 is connected to conductor 17 through the conductor 32, and a resistor 33. A feedback circuit is connected from collector 13 to the base 11 which as shown includes a pair of resistive elements and a capacitor. The circuit may be traced from a junction 37 on conductor 32 through a resistive element 34 having a negative temperature coefficient (NTC) and through a resistive element 35 having a positive temperature coefficient (PTC) and a capacitor 36 to the base 11.

In considering the operation of the amplifier in Figure 1 it will be noted that the battery 22 provides the electrical power required to energize the circuit. A load current path may be traced which commences at the positive terminal of battery 22, flows through emitter resistor 21, from emitter 12 to collector 13 of the transistor, through conductor 32, load resistor 33 and through conductor 17 to the negative terminal of the battery. The bias current path may also be traced, from the positive terminal of the battery 22 to junction 26, resistor 24, junction 27, resistor 25, and conductor 17 back to the negative terminal of the battery. The control signal to be amplified is applied across input terminals 15 and 16. A characteristic of the germanium or silicon transistor is that as the ambient temperature increases toward the maximum limit at which the transistor may be safely operated, the gain of the transistor decreases. Likewise, as the ambient temperature decreases to temperatures below zero degrees Fahrenheit the transistor gain decreases. In addition the bypass capacitor in the emitter circuit has a characteristic such that at lower temperatures the impedance of the capacitor to A.C. signals is increased. All of these factors affect a degenerative type of action on the amplifier power gain at the temperature extremes.

The feedback path from collector to base of the transistor 10 has in series an NTC and a PTC resistance element. The negative temperature coefficient material may be a thermistor and the element having the positive temperature coefficient may be such material as Balco or Ballast. The temperature responsive elements have been shown as two separate units however, this is shown for the purposes of clarity, and may if desired be a single unit having the required composite characteristics. The capacitor 36 in series with the resistors prevents any D.C. current from flowing through the feedback path.

As can be seen from an examination of curves A, B, and C of Figure 3, the temperature responsive elements are chosen so that the sum of the resistance of the PTC and NTC elements is at a minimum in the mid-temperature range. It is noted that as the temperature increases or decreases from this center range the summation of the NTC and PTC resistors increases in magnitude. In operation the effect is that the signal feedback is the maximum at mid-temperatures, and the feedback decreases to a minimum at high and low temperature ranges. Since in the embodiment shown, the feedback is a negative or degenerative feedback it is seen that the feedback varies inversely with the inherent transistor gain shown in curve D of Figure 3, so that the result of a non-linearly varying magnitude of feedback coupled with non-linear transistor power gain is a linear gain curve over the greatly extended temperature ranges. Figure 3 as drawn is representative of germanium transistor limits. A graph representation of silicon transistor would be similar but with the high temperature effects occurring at substantially higher temperatures than for germanium.

Referring now to Figure 2, there is shown a multistage transistor amplifier having the feedback path across three stages. The circuit includes a first transistor 40 having a base electrode 41, a collector electrode 42, and an emitter electrode 43. The base electrode 41 is connected to the input terminal 15 by a conductor 44, the other input terminal 16 is connected to a conductor 17 which is grounded at 20. The collector electrode 42 is connected to the ground conductor 17 through a load resistor 45. The emitter electrode 43 is connected to ground by a bypass capacitor 46. A source of potential 22, shown as a battery, is connected between ground conductor 17 and a conductor 50. The emitter is connected to the positive terminal of the battery through an emitter resistor 51 and the conductor 50. A junction 52 between a pair of biasing resistors 53 and 54 is connected to base 41 and provides the proper bias for a transistor stage 40. The biasing resistors are connected across the battery 22. A coupling capacitor 55 connects the output from the collector 42 of transistor 40 to the input of the second transistor 60. The second transistor 60 has a base electrode 61, a collector electrode 62, and an emitter electrode 63. The collector is connected to ground through a conductor 64, a load resistor 65 and ground conductor 17. The base electrode 61 is connected to the coupling capacitor 55. Biasing resistors 66 and 67, which are connected across the source, provide the proper bias for transistor 60. The emitter electrode 63 is connected to the positive terminal of the battery through emitter resistor 70 and the conductor 50. A bypass capacitor 71 is connected between the emitter 63 and ground conductor 17.

A third transistor 72 has a collector electrode 73, an emitter electrode 74, and a base electrode 75. The base electrode 75 of transistor 72 is connected to the collector electrode 62 of the preceding stage by a conductor 76, a coupling capacitor 77 and the conductor 64. Series connected biasing resistors 80 and 81 are connected across the source potential 22, and a junction 82 between the resistors is connected to the base electrode 75 to provide proper bias for the stage. The collector electrode 73 is connected to the ground terminal 17 through a load device 83 here shown as a transformer. The emitter 74 is connected to the positive terminal of battery 22 through emitter resistor 84 and the conductor 50. A bypass capacitor 85 connects the emitter 74 to the ground conductor 17.

The collector 73 of the output stage 72 is connected to the base 41 of the first transistor by means of a feedback path which includes the conductor 86, junction 87, a conductor 90, NTC resistor 34, PTC resistor 35, capacitor 36, and conductor 91 to the base electrode 41 of the transistor 40.

The operation of the feedback look of Figure 2 is identical with that as explained in Figure 1. Figure 2 shows a conventional type RC coupled transistor amplifier with the stages connected in the common emitter configuration. The emitter resistors 51, 70, and 84 provide D.C. temperature stabilization, as is well known in the art. The particular values of the PTC and NTC resistors in Figure 2 may be different than in Figure 1 for the obvious reason that the overall gain of the two amplifiers are different.

In one successful embodiment of the circuit the following values were used:

| | |
|---|---|
| Resistors **53, 66** | 8.5K ohms. |
| Resistors **54, 67** | 6.5K ohms. |
| Resistors **51, 70** | 12K ohms. |
| Resistors **45, 65** | 10K ohms. |
| Resistor **80** | 2.3K ohms. |
| Resistor **81** | 780 ohms. |
| Resistor **84** | 1.8K ohms. |
| Capacitors **46, 71, 85** | 20 $\mu$fd. tantalum. |
| Capacitors **55, 77** | 20 $\mu$fd. |
| Capacitor **36** | 10 $\mu$fd. |
| Transformer **83** | Gramer 4000—50 ohms. |
| Transistors | Junction PNP. |
| Battery | 28 volts. |
| PTC resistance | Balco 5000 ohms. @ 75° F. |
| NTC resistance | Keystone NTC resistance unit. |

Curves A, B, and C of Figure 3 show graphically the values of resistance in the feedback path plotted with temperature, which were used in a successful test of the circuit of Figure 1. This circuit as shown in Figure 1 was used as a second stage of a three stage RC coupled amplifier. The resulting configuration was as shown in Figure 2 with the feedback loop between collector and base of the second stage rather than between third stage collector and first stage base as shown in Figure 2. Curve A is a plot of resistance value of the NTC resistor against temperature. Curve B is a plot of the resistance value of the PTC resistor against temperature, and curve C is the sum of curves A and B.

The curves of overall amplifier gain are also shown, with curve D showing the gain with the feedback path disconnected. Curve E shows the overall amplifier gain when an ordinary resistance is substituted for the temperature sensitive resistors. Curve F shows the gain of the amplifier made linear over an extended temperature range by the use of the temperature sensitive elements in the feedback path. It will be noted that the PTC and NTC resistors are chosen to have a particular coefficient of change with temperature so that the normal decrease in power gain of the transistor is corrected and compensated by a decrease in the amount of negative feedback.

An RC coupled amplifier has been shown in Figure 2 for purposes of explanation, however, the invention is not limited to RC coupling but may be used equally well on direct coupled or transformer coupled circuits.

Although the embodiments shown have been involved with a circuit having negative feedback, it is clear that similar units could be used in a positive feedback loop where required.

In general, while I have shown certain specific embodiments of my invention, it is to be understood that this is for the purposes of illustration and that my invention is to be limited solely by the scope of the appended claims.

I claim:

1. Gain stabilized transistor amplifier apparatus comprising: transistor means tending to have a decrease of power gain at relatively low and at relatively high temperatures, said means having a plurality of electrodes including base, collector, and emitter electrodes, said emitter and base electrodes being input electrodes, said collector and another of said electrodes being output electrodes; means connecting said input electrodes to an alternating current signal source; output means connected to said output electrodes; impedance means comprising in series a resistive portion having a negative temperature coefficient and a resistive portion having a positive temperature coefficient; and signal feedback means including capacitor means connecting said impedance means from said collector electrode to one of said input electrodes, the magnitude of said impedance means increasing at relatively low and at relatively high temperatures so that the resulting reduction in feedback signal at aforesaid low and high temperatures compensates for the corresponding nonlinearity of transistor power gain to provide a linear output over extended temperature ranges.

2. Gain stabilized semi-conductor amplifier apparatus comprising; semi-conductor amplifier means tending to have an inherent decrease in power gain at ambient temperature extremes of relatively high and relatively low temperatures, said semi-conductor means having a plurality of electrodes including input and output electrodes; means connecting said input electrodes to a source of alternating current signal potential; output load means connected to said output electrodes; temperature affected impedance means comprising in series a resistive portion having a positive temperature coefficient, a resistive portion having a negative temperature coefficient and capacitor means; and alternating current signal feedback means connecting said temperature affected impedance means from the output of said semi-conductor means to the input, the magnitude of said impedance means increasing at relatively low and at relatively high temperatures so that the resulting reduction in feedback signal at the aforesaid low and high temperatures compensates for the corresponding nonlinearity of semi-conductor power gain to provide a linear power output over extended temperature ranges.

3. Apparatus for improving the linearity of signal amplification of semiconductor amplifier means which has a decrease of signal amplification at relatively low and at relatively high ambient temperatures comprising: semiconductor amplifying means having a plurality of electrodes including an input electrode, an output electrode, and a further electrode; circuit means connecting said electrodes to a source of electrical power for energizing said amplifying means; means connecting said input electrode and said further electrode to a source of alternating current electrical signal; temperature responsive resistive means comprising a first portion having a negative temperature coefficient and a second portion having a positive temperature coefficient; and signal feedback means connected to provide a negative signal feedback in said amplifying means, said feedback means being connected intermediate said output electrode and said input electrode and comprising in series capacitor means and said temperature responsive resistance means, the magnitude of the resistance means increasing at relatively high and also at relatively low temperatures so that the resulting reduction in degenerative feedback signal at said high and low temperatures tends to compensate for the decrease in signal amplification at said high and low temperatures.

4. Apparatus for improving the linearity of signal amplification of a semi-conductor amplifier which has a decrease of signal amplification at relatively low and at relatively high ambient temperatures, comprising: semiconductor amplifying means having a plurality of electrodes including an input electrode, an output electrode, and a common electrode; a source of electrical power; means connecting said source to said electrodes thereby energizing said amplifying means; circuit means connecting said input electrode and said common electrode to an input signal source; further circuit means connecting said output electrode and said common electrode to suitable load means; temperature responsive impedance means exposed to the ambient temperatures surrounding said amplifying means, said means having a first portion comprising a resistive element having a negative temperature coefficient of resistance and having a second portion comprising a resistive element having a positive temperature coefficient of resistance; and signal feedback means for providing a negative signal feedback comprising in series capacitor means and said temperature responsive impedance means, said signal feedback means being connected intermediate the output electrode and the input electrode of said amplifying means, the magnitude of the feedback impedance increasing at relatively high and also at relatively low temperatures so that the resulting reduction in degenerative feedback signal at said high and low temperatures tends to compensate for the decrease in signal amplification at said high and low temperatures.

5. Amplifier apparatus for alternating current signals comprising: semiconductor amplifying means having a plurality of electrodes including an input electrode, an output electrode and a further electrode; a source of electrical power; means connecting said source of power to said electrodes thereby energizing said amplifying means; circuit means connecting said input electrode and said further electrode to an alternating current input signal source; circuit means connecting said output electrode and said further electrode to suitable load means; said amplifying means tend to have an undesirable characteristic of its amplifier power gain to alternating current signals varying in a non-linear manner with respect to ambient temperature at relatively low and also at relatively high temperature extremes, said power gain varying as a direct non-linear function with respect to ambient temperature changes at one of said temperature extremes and varying as an inverse non-linear function with respect to ambient temperature changes at the other of said temperature extremes; temperature responsive impedance means including in series capacitor means and resistive means exposed to said ambient temperature and having its impedance variable in magnitude with said temperature in a manner related to the gain of said amplifying means over the temperature range, said temperature responsive impedance means having its impedance vary as an inverse function of said amplifier power gain at said low and high temperature extremes; and feedback circuit means degeneratively connecting said impedance means intermediate said output electrode and said input electrode to provide an alternating current feedback circuit, so that the effect in the feedback loop of the variation in magnitude of said impedance means with ambient temperature change on the gain of the alternating current signal is such as to tend to stabilize the amplifier gain over extended temperature ranges.

References Cited in the file of this patent

UNITED STATES PATENTS

| | | |
|---|---|---|
| 2,369,030 | Edwards | Feb. 6, 1945 |
| 2,431,306 | Chatterjea et al. | Nov. 25, 1947 |
| 2,548,901 | Moe | Apr. 17, 1957 |
| 2,801,297 | Becking et al. | July 30, 1957 |
| 2,808,471 | Poucel et al. | Oct. 1, 1957 |

OTHER REFERENCES

Shea text, "Principles of Transistor Circuits," pages 175–181, pub. 1953 by John Wiley & Sons, N.Y.C.